(12) United States Patent
Seo et al.

(10) Patent No.: US 6,590,473 B1
(45) Date of Patent: Jul. 8, 2003

(54) THIN-FILM BANDPASS FILTER AND MANUFACTURING METHOD THEREOF

(75) Inventors: O-Gweon Seo, Kyungki-do (KR); Duck-Su Kim, Kyungki-do (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/689,590

(22) Filed: Oct. 13, 2000

(30) Foreign Application Priority Data

Oct. 15, 1999 (KR) ......................................... 1999-44752

(51) Int. Cl.⁷ ................................................. H03H 7/01

(52) U.S. Cl. ....................................... 333/185; 333/175

(58) Field of Search ................................. 333/174, 184, 333/185

(56) References Cited

U.S. PATENT DOCUMENTS

| | | | | |
|---|---|---|---|---|
| 4,573,101 A | * | 2/1986 | Takeno ........................ | 333/185 |
| 4,714,905 A | * | 12/1987 | Bernstein et al. ........ | 333/185 X |
| 4,885,562 A | * | 12/1989 | Ouvrard et al. ......... | 333/185 X |
| 5,539,241 A | * | 7/1996 | Abidi et al. ................. | 257/516 |
| 6,175,727 B1 | * | 1/2001 | Mostov ....................... | 174/255 |

OTHER PUBLICATIONS

Park et al., "Packaging–Compatible High Q Microinductors and Microfilters for Wireless Applications, " IEEE Transactions on Advanced Packaging, vol. 22, No. 2, May. 1999, pp. 207–213.*

* cited by examiner

Primary Examiner—Justin P. Bettendorf
(74) Attorney, Agent, or Firm—Robert E. Bushnell, Esq.

(57) ABSTRACT

A thin-film bandpass filter is provided. The thin-film bandpass filter includes a substrate, a plurality of first capacitors formed on the substrate, each being electrically connected in series, at least one second capacitor electrically connected to branch terminals positioned between the plurality of first capacitors, an inductor electrically connected in parallel to the second capacitor, and a plurality of supports for propping up the inductor so that the inductor is separated a predetermined space above the substrate and/or the second capacitor. The first and second capacitors, respectively, include a first metal layer, a dielectric layer, and a second metal layer, all of which are sequentially formed on the substrate. The inductor is comprised of a predetermined pattern of a thin-film metal layer propped by the plurality of supports, to both ends of which are electrically connected to the first and second metal layers of the second capacitor, and suspended by the substrate and/or the second capacitor. Due to a structure in which the inductor is suspended by the substrate and/or the capacitor that the thin-film bandpass filter has, the parasitic capacitance can be minimized, thereby enhancing the Q factor and minimizing the insertion loss of the filter. Furthermore, the overall size of the filter is significantly reduced by forming at least a portion of an inductor on the capacitor.

23 Claims, 13 Drawing Sheets

THIN-FILM BANDPASS FILTER AND MANUFACTURING METHOD THEREOF

CLAIM OF PRIORITY

This application makes reference to, incorporates the same herein, and claims all benefits accruing under 35 U.S.C. §119 from my application THIN-FILM BAND PASS FILTER AND METHOD FOR MANUFACTURING IT filed with the Korean Industrial Property Office on Oct. 15, 1999 and there duly assigned Ser. No. 1999/44752

BACKGROUND OF THE INVENTION

1. Field of the Invention

The present invention relates to a bandpass filter that filters an input electrical signal to pass only signals in a specific frequency band, and more particularly to, a thin-film bandpass filter in which a spiral inductor and a capacitor are formed in a thin-film shape, and a manufacturing method thereof.

2. Description of the Related Art

In general, bandpass filters use a principle that impedance in combination of an inductor and a capacitor changes depending on a frequency. In other words, since a resonant frequency $f_0$ equals $$\frac{1}{2\pi\sqrt{LC}}$$

when an inductor L and a capacitor C are connected in series, a filter for passing only signals of a specific frequency band may be embodied by repeating the arrangement of the inductor L and the capacitor C. As a filter operated within the range of a microwave frequency of 500 MHz or higher, a thin-film microwave bandpass filter, as shown in FIG. 1, has been proposed. The thin-film bandpass filter consists of a plurality of capacitors 32 formed by appropriately stacking and arranging a metal layer and an insulating layer on a planar substrate 12, a plurality of spiral inductors 10, and electrical connection. In this case, the spiral inductors 10 and capacitors 32 are electrically connected in series, alternately, by a lead pattern, and the spiral inductors 10 are disposed at the ends. As shown in FIG. 2, each capacitor 32 includes a pair of first metal layers 34 and 36 which are separated by a predetermined gap G on the planar substrate 12, an insulating layer 40 formed on at least a portion of the top surface of the first metal layers 34 and 36, a second metal layer 42 overlapping the first metal layers 34 and 36 and formed on the top surface of the insulating layer 40.

As shown in FIGS. 1 and 3, each spiral inductor 10 is formed in a spiral shape and including first and second traces 22 and 24 comprised of first metal layers 16 and 18 formed on the planar substrate 12, a connection bridge 28 comprised of a second metal layer 18, overlying the first metal layers 16 and 18 and connecting between the first and second traces 22 and 24, and an insulating layer 20 for insulating the intersection portion.

The first trace 22 is looped into a coil and ends at an interior end 26. The second trace 24 is disposed parallel and adjacent to the periphery of the first trace 22. The connection bridge 28 contacts the interior end 26 of the first trace 22 while being connected to the second trace 24 across an intermediate portion 30 of the first trace 22. In this case, the insulating layer 20 isolates the connection bridge 28 from the intermediate portion 30 of the coiled trace. Reference numerals 1 and denote contact pads. The thin-film bandpass filter described above has a structure in which the spiral inductors 10 and the capacitors 32 are alternately connected in series between the contact pads 1 and 5.

Since the conventional thin-film bandpass filter has a two-dimensional structure in which the inductors are attached to the substrate 12, a parasitic capacitance is generated between the inductors 10 and the substrate 12 to a great extent, and accordingly, the Q factor of the inductor 10 is reduced. Therefore, the conventional bandpass filter has smaller resonant frequency of the inductor 10 itself. Accordingly, the inductor 10 is of a narrower range for use. Also, the insertion loss of the bandpass filter is increased. Thus, the conventional thin-film bandpass filter has a drawback in that a process of amplifying a signal that passes through the filter is further required. Furthermore, there is another problem in that the overall size of the bandpass filter is large since inductors and capacitors are connected in series with the plane substrate 12 unfolded. However, when such a bandpass filter is implemented on a semiconductor chip, the filter consumes a large amount of precious space. In addition, the inductor may contain a parasitic capacitance which is unwanted. Furthermore, the insertion loss of the filter may be high, there may be a low resonant frequency, and the cost for manufacturing the bandpass filter may be excessive.

What is needed is a design for a bandpass filter implemented on a semiconductor chip, that is small, has a low manufacturing cost, low insertion loss, a higher resonant frequency, and eliminates the problem of parasitic capacitances.

SUMMARY OF THE INVENTION

It is therefore an object of the present invention to provide an improved design and an improved method of manufacture of a thin film bandpass filter.

It is also an object of the present invention to provide a bandpass filter that is space efficient. It is yet another object of the present invention to provide a bandpass filter that is easy and inexpensive to manufacture.

It is still an object of the present invention to provide a thin film bandpass filter that has a low insertion loss.

It is still yet another object of the present invention to provide a thin film bandpass filter that reduces and eliminates parasitic capacitances.

It is yet also an object of the present invention to provide a semiconductor bandpass filter that has a higher resonant frequency.

Accordingly, to achieve the above object, the present invention provides a thin-film bandpass filter including: a substrate; a plurality of first capacitors formed on the substrate, each being electrically connected in series; at least one second capacitor electrically connected to branch terminals positioned between the plurality of first capacitors; an inductor electrically connected in parallel to the second capacitor; and a plurality of supports for propping up the inductor so that the inductor is separated a predetermined space above the substrate and/or the second capacitor. The first and second capacitors, respectively, include a first metal layer, a dielectric layer, and a second metal layer, all of which are sequentially formed on the substrate. The inductor is comprised of a predetermined pattern of a thin-film metal layer propped by the plurality of supports, to both ends of which are electrically connected to the first and second metal layers of the second capacitor, and suspended by the substrate and/or the second capacitor.

Furthermore, the inductor includes a spiral inductor portion having at least one turn, formed in a flat spiral shape above the supports and propped by the supports; a first connecting portion for electrically connecting an interior end of the spiral inductor portion and one metal layer of the second capacitor, the first connection portion including a vertical portion extending downward from the interior end of the spiral inductor portion, and a horizontal portion extending from one side of the vertical portion to be separated from the spiral inductor portion; and a second connecting portion for electrically connecting an exterior end of the spiral inductor portion and the other metal layer of the second capacitor, the second connection portion including a vertical portion extending downward from the exterior end of the spiral inductor portion. In this case, preferably, at least a portion of the supports are formed on the second capacitor and at least a portion of the spiral inductor portion of the inductor is positioned above the second capacitor.

The present invention also provides a method of manufacturing a thin-film bandpass filter including the steps of: preparing a substrate; sequentially providing a first metal layer, a dielectric layer and a second metal layer at predetermined positions on the substrate to form a plurality of first capacitors, each of which is independent, and at least one second capacitor; providing a plurality of contact pads and a lead pattern on the substrate to form an electrical connection structure between the first and second capacitors so that the first capacitors are electrically connected in series to each other by the lead pattern and the second capacitor is connected to a branch terminal formed between the first capacitors; forming a plurality of supports having a predeterminedheight on the substrate and/or the second capacitor; and forming an inductor including first and second connecting portions electrically connected to the first and second metal layers of the second capacitor, and an inductor portion formed of a predetermined pattern of a metal layer on the supports and propped by the supports, and in which both ends of the inductor portion are connected in parallel to the second capacitor by the first and second connecting portions. In this case, preferably, at least a portion of the supports are formed on the second capacitor and at least a portion of the inductor portion is positioned above the second capacitor. The method further includes the step of forming an insulating layer on a region of the second capacitor excluding a portion for electrically connecting the inductor portion and the first and second metal layers.

The first connecting portion comprises a first vertical portion extending downward from an interior end of the inductor portion, and a horizontal portion extending from one side of the second vertical portion, separated from the inductor portion, and electrically connected to one metal layer of the second capacitor. The second connecting portion comprises a second vertical portion extending downward from an exterior end of the inductor portion and electrically connected to the other metal layer of the second capacitor. The step of forming the inductor includes the steps of: forming a position pattern of the second vertical portion of the second connecting portion and the horizontal portion of the second connecting portion using a photoresist to provide a lower metal layer at the positions of the second vertical portion and the horizontal portion; forming a position pattern of the first vertical portion of the first connecting portion and the second vertical portion of the second connecting portion using a photoresist to provide an upper metal layer at the positions of the first and second vertical portions; providing a metal layer in a predetermined pattern on the photoresist layers and the upper metal layer to form the inductor portion; and removing the photoresist layers. In this case, the supports are comprised of the same metal material as the vertical portions of the first and second connecting portions, and a support position pattern is formed and then the lower and upper metal layers are formed at the support position, in the step of forming the vertical portions of the first and second connecting portions.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein:

FIGS. 11–18 are sectional views taken along line XI—XI of FIG. 10;

DETAILED DESCRIPTION OF THE INVENTION

Figure 1:
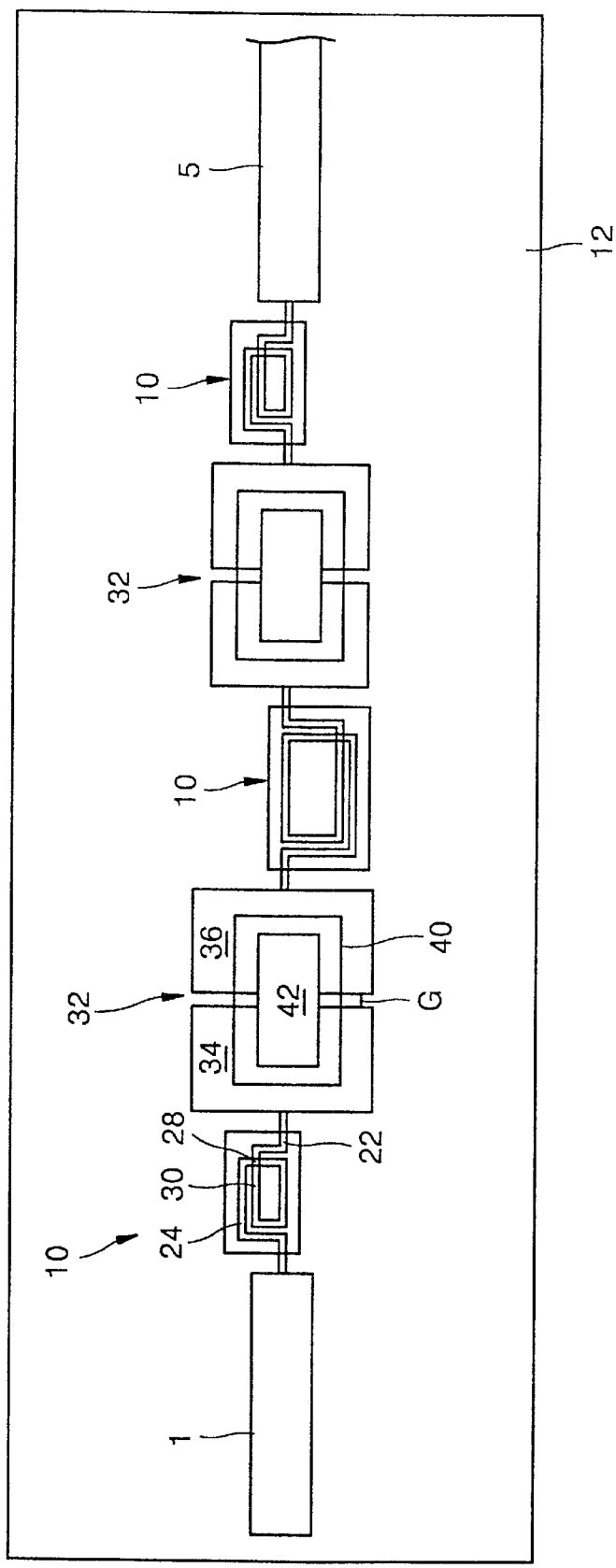
FIG. 1 schematically illustrates an example of a conventional thin-film bandpass filter.
Figure 2:
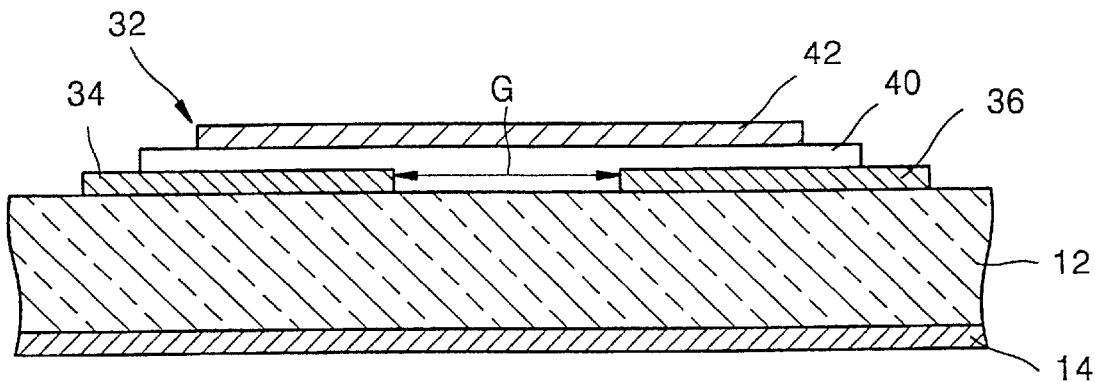
FIG. 2 is a sectional view of the thin-film bandpass filter taken along line II—II of FIG. 1.
Figure 3:
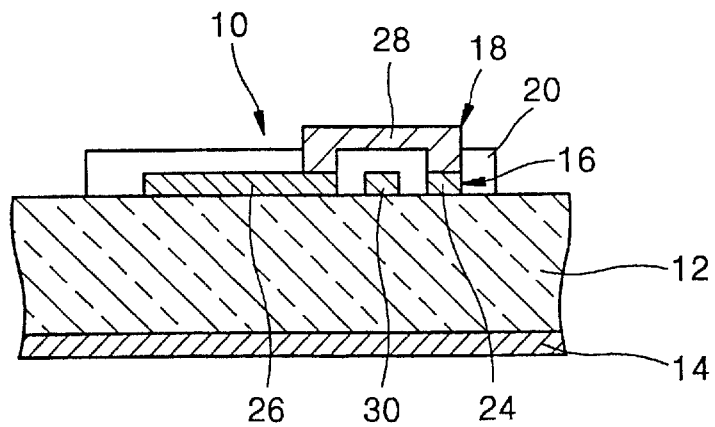
FIG. 3 is a sectional view of the thin-film bandpass filter taken along line III—III of FIG. 1.
Figure 4:
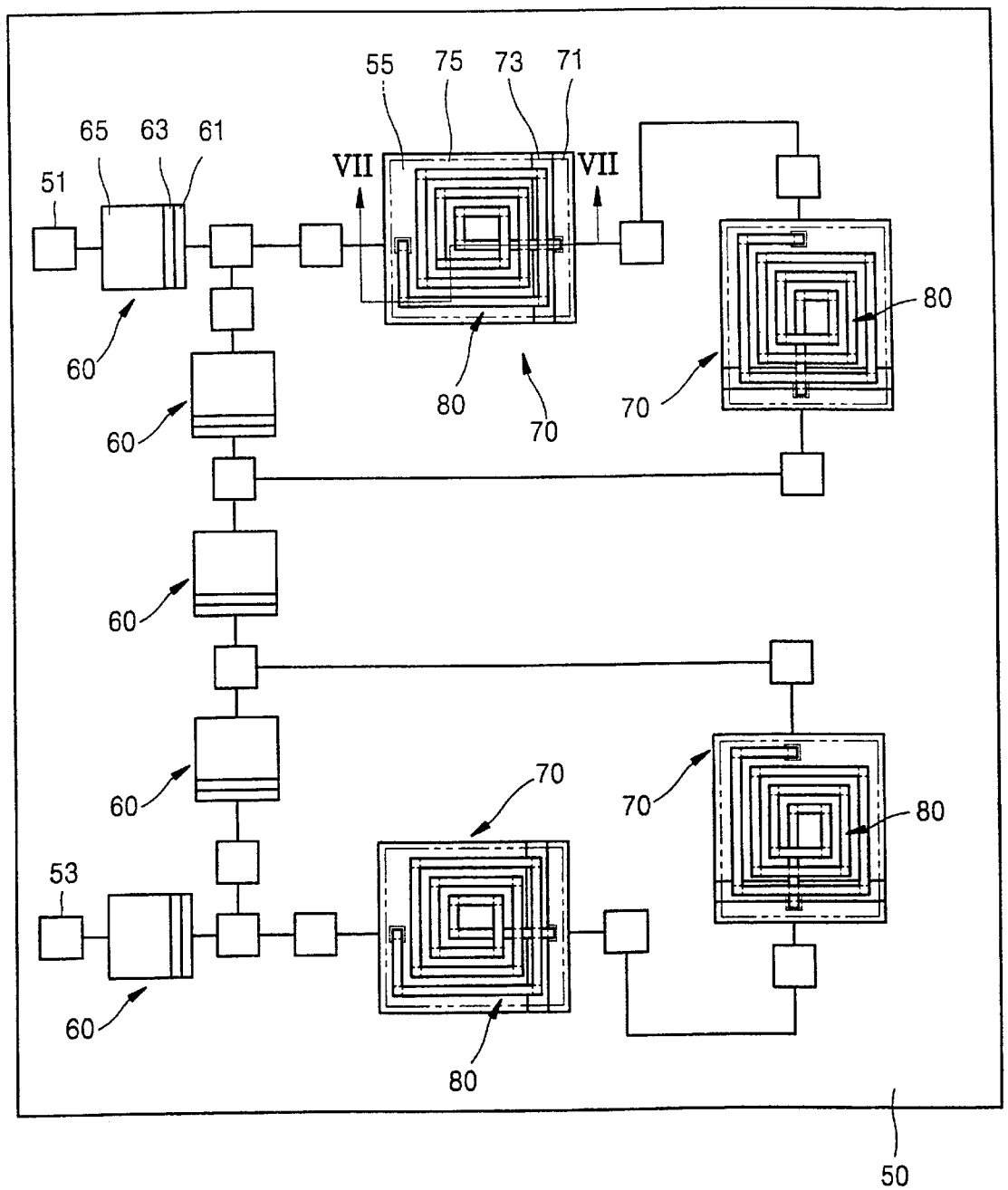
FIG. 4 is a plan view schematically illustrating the structure of a thin-film bandpass filter according to a preferred embodiment of the present invention.

Referring to FIGS. 4–7, a thin-film bandpass filter according to a preferred embodiment of the prevent invention includes a substrate 50, a plurality of first capacitors 60 formed on the substrate 50 and connected in series to one another, second capacitors 70 electrically connected to branch terminals that branch off from between the first capacitors 60, inductors 80 connected in parallel to the second capacitors 70, and a plurality of metal supports 90 for propping up the inductors 80 in such a way as to be a predetermined height above the substrate 50 and/or the second capacitors 70. FIG. 4 shows an example in which a thin-film bandpass filter consists of five first capacitors 60, and four pairs of second capacitors 70 and inductors 80, but the layout condition may change depending on filtering requirements.

On a substrate 50, lead patterns for connecting the first capacitors 60 in series, lead patterns for diverging from the branch terminals between the first capacitors 60 to connect the second capacitors 70 and the inductors 80 in parallel and a pair of contact pads 51 and 53 which are connected by the lead patterns with the outermost first capacitors 60 in order to input an electrical signal to be filtered to the filter and output the filtered signal are formed. In addition, a plurality of contact pads 54 are formed at both ends of each element, i.e., capacitors 60 and 70 and/or inductors 80, for checking each element. In this case, the ends of one side of the second capacitors 70 and the inductors 80 are grounded.

Figure 5:
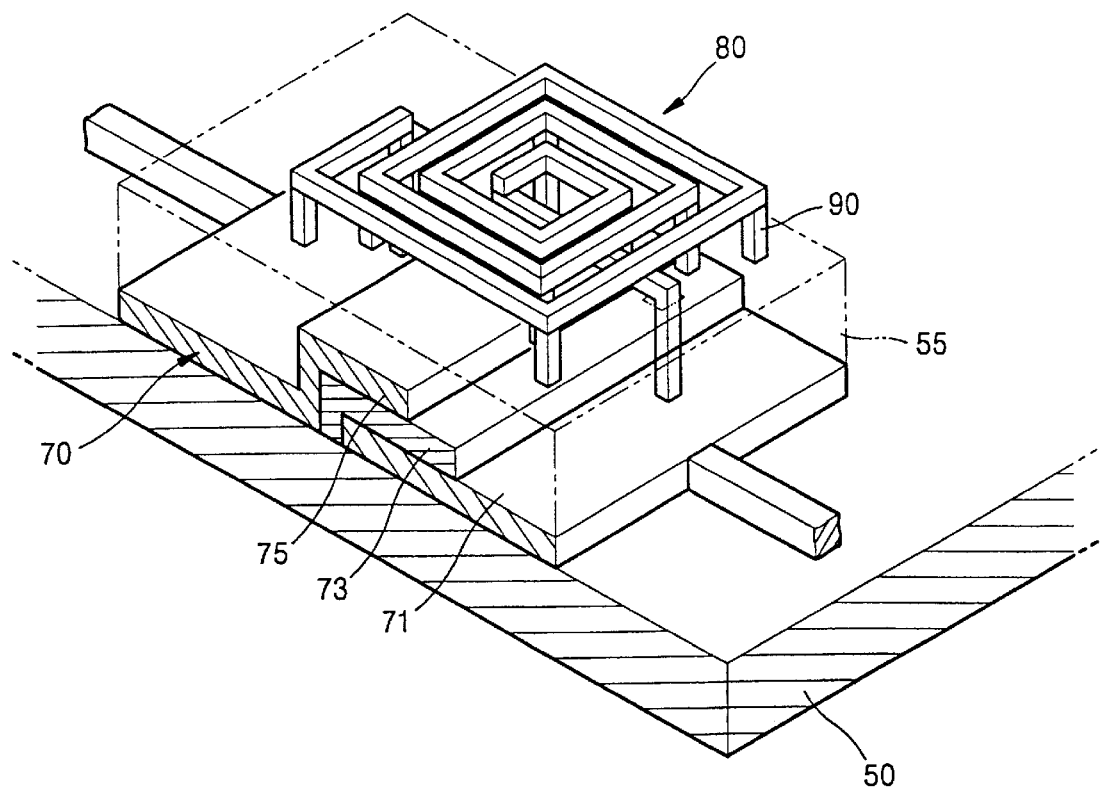
FIG. 5 is a perspective view of the main portion of the thin-film bandpass filter of FIG. 4.
Figure 6:
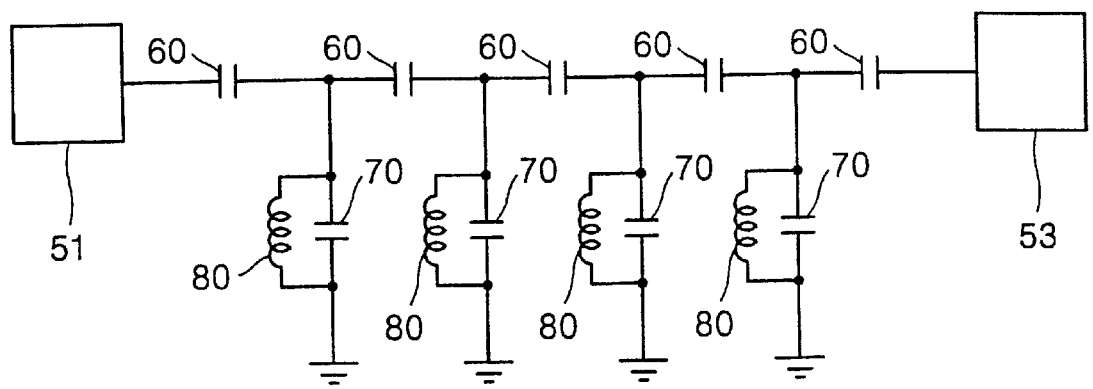
FIG. 6 illustrates the equivalent circuit of the thin-film bandpass filter of FIG. 4.
Figure 7:
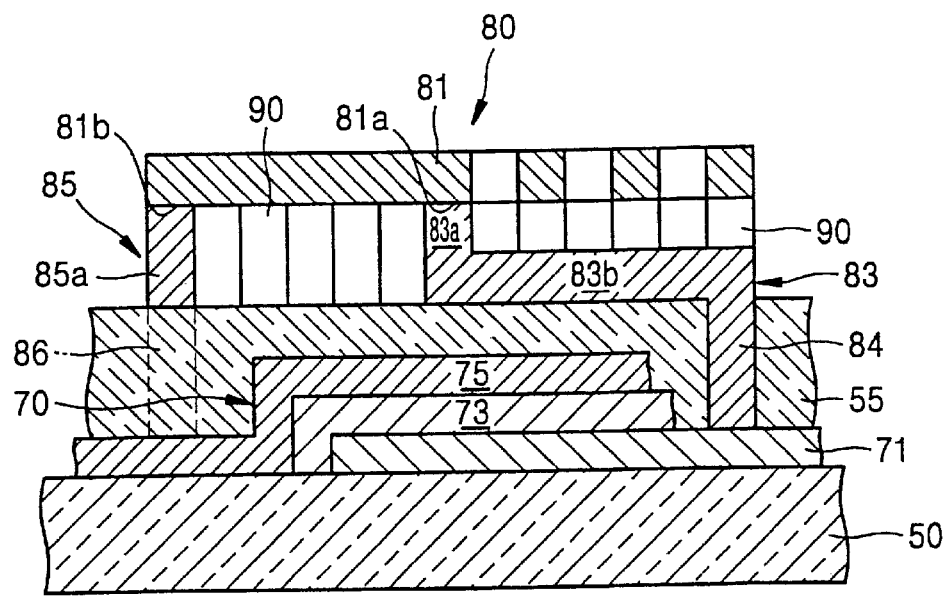
FIG. 7 is a sectional view of the thin-film bandpass filter taken along line VII—VII of FIG. 4.

The substrate 50 is preferably comprised of ceramic, plastic, or print-circuit board (PCB) material, and the substrate 50 is an electrical insulator. The first capacitor 70 includes a first metal layer 61, a dielectric layer 63, and a second metal layer 65, all of which are sequentially formed on the substrate 50. The second capacitor 70 includes a first metal layer 71, a dielectric layer 73, and a second metal layer 75, all of which are sequentially formed on the substrate 50. The second capacitor 70, as shown in FIGS. 5 and 7, are preferably formed so that portions of the dielectric layer 73 and the second metal layer 75 oppose the substrate 50, and the first capacitor 60 has the same structure. If both capacitors 60 and 70 are structured in this way, the second metal layers 65 and 75 may be directly connected to a lead pattern.

The inductor 80 is comprised of a predetermined pattern of a thin film metal layer propped up by the plurality of supports 90, both ends of which are electrically connected to the first and second metal layers 71 and 75 of the second capacitor 70. More specifically, the inductor 80 is formed in a flat spiral configuration above the supports 90, including a spiral inductor portion 81 having a predetermined number of turns supported by the supports 90, a first connecting portion 83 for electrically connecting an interior end 81 a of the spiral inductor portion 81 and the first metal layer 71 of the second capacitor 70, and a second connecting portion 85 for electrically connecting an exterior end 81b of the spiral inductor portion 81 and the second metal layer 75 of the second capacitors 70. FIG. 4 illustrates an example in which the spiral inducting portion 81 having three turns.

The spiral inductor portion 81 is separated from and above the substrate 50 and/or the second capacitor 70. The first connecting portion 83 includes a vertical portion 83a extending downward from the interior end 81a, and a horizontal portion 83b extending from one side of the vertical portion 83a and separated from the spiral inductor portion 81. The second connecting portion 85 includes a vertical portion 85a extending downward from the exterior end 81b. The horizontal portion 83b of the first connecting portion 83 and the vertical portion 85a of the second connecting portion 85 are electrically coupled to the first and second metal layers 71 and 75 of the second capacitor 70, respectively. Preferably, the inductor 80 has a structure in which it is suspended on the second capacitor 70 by forming the supports 90 on the second capacitor 70 and providing the spiral inductor portion 81 of the inductor 80 on the supports 90. This structure has an advantage in that the overall size of the filter is significantly reduced, compared to the structure in a conventional art. In this case, in order to form the horizontal portion 83b of the first connecting portion 83 in such a way as to be isolated from the second metal layer 75 of the second capacitor 70, it is preferable to further include an insulating layer 55 in the region excluding the portion for electrically connecting the inductor 80 and the first and second metal layers 71 and 75. Here, the insulating layer 55 is indicated in an imaginary line in FIGS. 4 and 5, in order to show the structure of the second capacitor 70 positioned thereunder.

As described above, in the case in which a portion of the second capacitor 70 is structured to face the substrate 50, the ends of one side of the horizontal portion 83b of the first connecting portion 83 and the vertical portion 85a of the second connecting portion 85 are electrically coupled to the first and second metal layers 71 and 75, respectively, by base portions 84 and 86 extending downward from the ends of one side of the horizontal portion 83b and the vertical portion 85a. The base portions 84 and 86 may be excluded by appropriately designing the shape of the electrical coupling region of the first and second metal layers 71 and 75 electrically connected with the first and second connecting portions 83 and 85. Although it has been described that the inductor is positioned above the second capacitor 70, only a portion of the inductor 80 may be positioned above the second capacitor 70. Furthermore, the inductor 80 is formed in such a way as to be separated a predetermined height above the substrate 50 and to be horizontally separated above the second capacitor 70. In this case, since the substrate 50 serves as an insulator, the insulating layer 55 may not be formed, and the horizontal portion 83b of the first connecting portion 83 and the vertical portion 85a of the second connecting portion 85, respectively, are electrically connected to the first and second metal layers 71 and 75 by a lead pattern (not shown).

The plurality of supports 90 for propping up the spiral inductor portion 81 of the inductor 80 in such a way as to be separated from the second capacitor 70 or the substrate 50 is preferably comprised of the same metal material as for the first an second connecting portions 83 and 85. In this case, the supports 90 can be formed together with the vertical portions 83a and 85a, thereby significantly simplifying the manufacturing process. Actually, the vertical portions 83a and 85a of the first and second connecting portions 83 and 85 act as a support for propping up the interior end 81aand the exterior end 81b of the inductor 80. Alternatively, the supports 90 may be comprised of nonconducting materials such as insulating materials.

Figure 8:
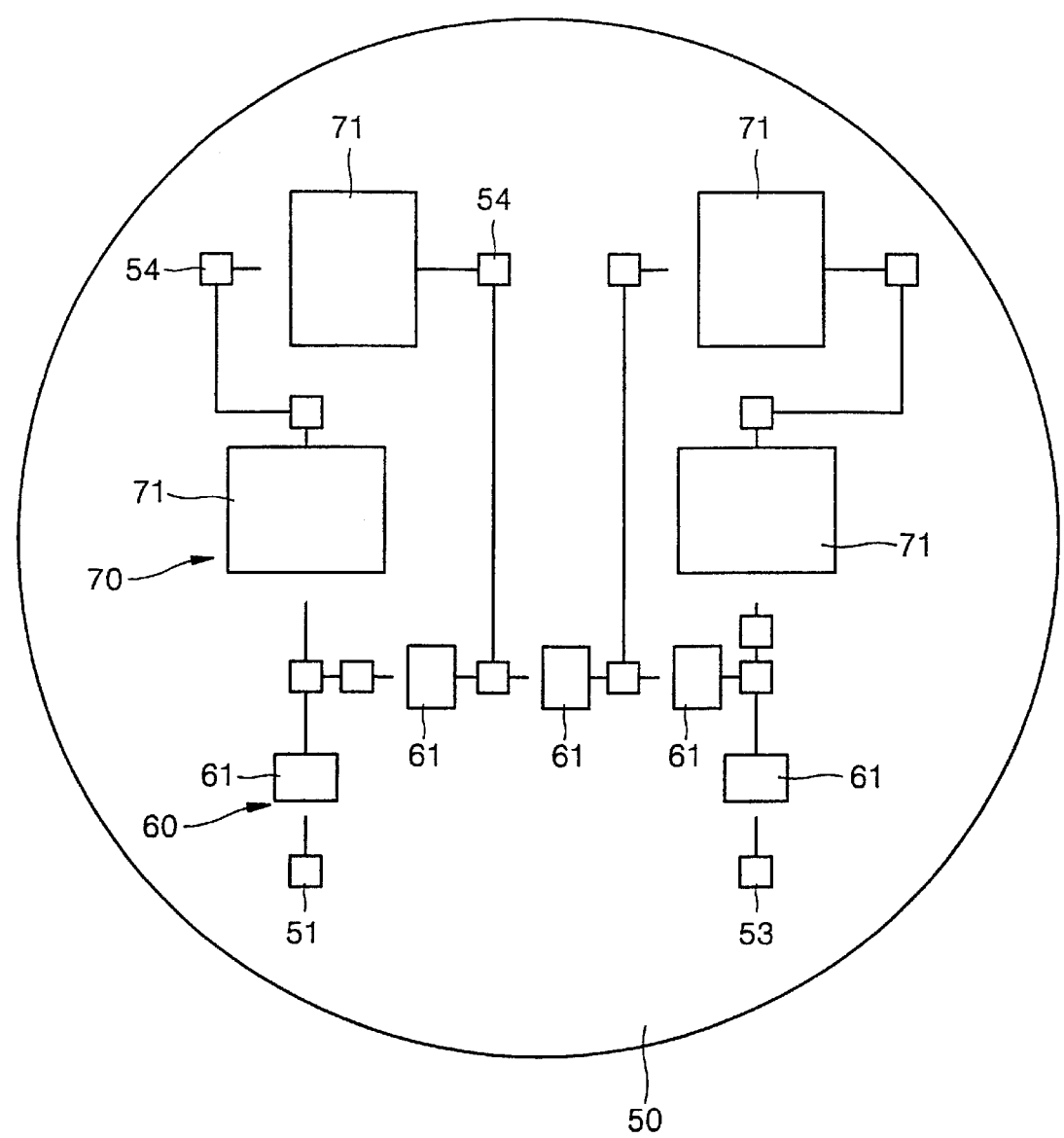
FIGS. 8–18 schematically illustrate a process of manufacturing the thin-film bandpass filter according to the present invention.

A method of manufacturing a thin-film bandpass filter according to a preferred embodiment of the present invention, having a structure in which the inductor 80 is suspended by the second capacitor 70, as shown in FIGS. 4–7, will now be described with reference to FIGS. 8–18. First, as shown in FIG. 8, first metal layers 61 and 71 of a plurality of first capacitors 60 and at least one second capacitor 70, a pair of contact pads 51 and 53 and lead patterns are formed on a prepared substrate 50. In addition, a plurality of contact pads 54 are formed for checking each element. The substrate 50 is preferably made of ceramic, plastic, or PCB material so that the substrate 50 itself serves as an insulator. The lead patterns are formed so that the first capacitors 60 are connected in series to one another and that the second capacitors 70 are each connected to different branch terminals disposed between the first capacitors 60. In this case, the lead pattern is electrically connected on one side of the first and second metal layers 61 and 71 of the first and second capacitors 60 and 70, while the lead pattern is separated by a predetermined space on the other side of the first and second metal layers 61 and 71. The separated one end of the lead pattern is electrically connected to second metal layers 65 and 75 in manufacturing the second metal layers 65 and 75 of the first and second capacitors 60 and 70 for a subsequent process.

The pair of contact pads 51 and 53 are formed at the ends of the plurality of first capacitors 60 arranged in series, and electrically connected by a lead pattern to the first or second metal layers 61 and 65 of the outermost first capacitors 60. FIG. 8 shows an example in which a lead pattern is formed so that the contact pads 51 and 53 are electrically connected to the second metal layer 65 manufactured by a subsequent process. An electrical signal subjected to filtering is input through the one contact pad 51 and the filtered electrical signal is output through the other contact pad 53.

Figure 9:
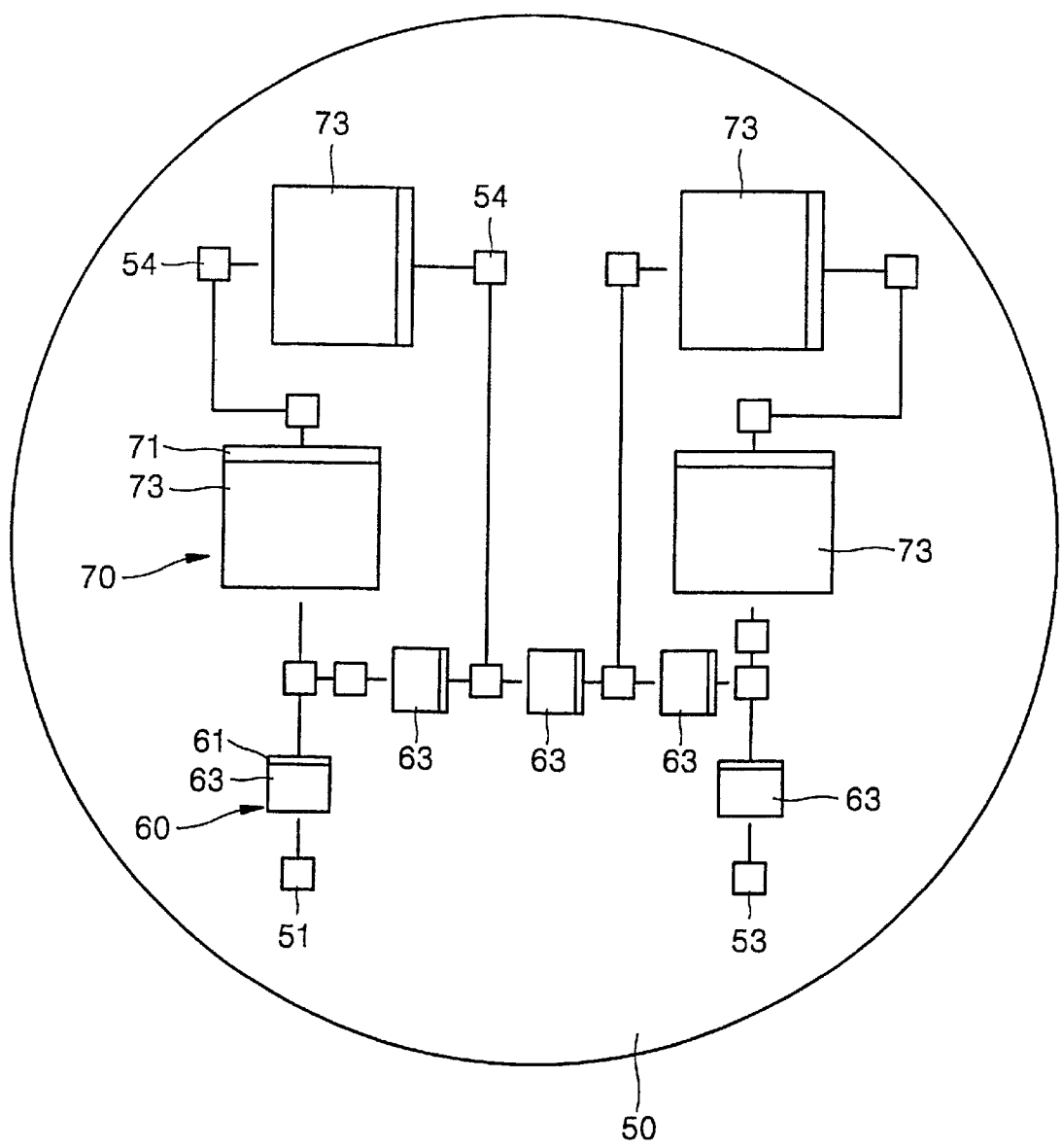

Next, as shown in FIG. 9, dielectric layers 63 and 73 are formed on the first metal layers 61 and 71 of the first and second capacitors 60 and 70. In order to directly connect the second metal layers 65 and 75 to the lead pattern in forming the second metal layers 65 and 75 for a subsequent process, the dielectric layers 63 and 73 are formed so that portions thereof oppose the substrate 50 covering each one side of the first metal layers 61 and 71. In this case, dielectric layers 73 of the second capacitors 70 is preferably formed so that a portion of the top surface of the other side of the first metal layer 71 is exposed. The exposed portion of the first metal layer 71 is a region that electrically contacts a connecting portion 83 of an inductor 80 formed by a subsequent process. FIG. 8 shows an example in which the dielectric layers 63 and 73 are formed in such a way as to expose portions of the top surfaces of the first metal layers 61 and 71 of the first and second capacitors 60 and 70. If necessary, wire bonding between the first metal layers 61 and 71 and the lead pattern may be performed.

Figure 10:
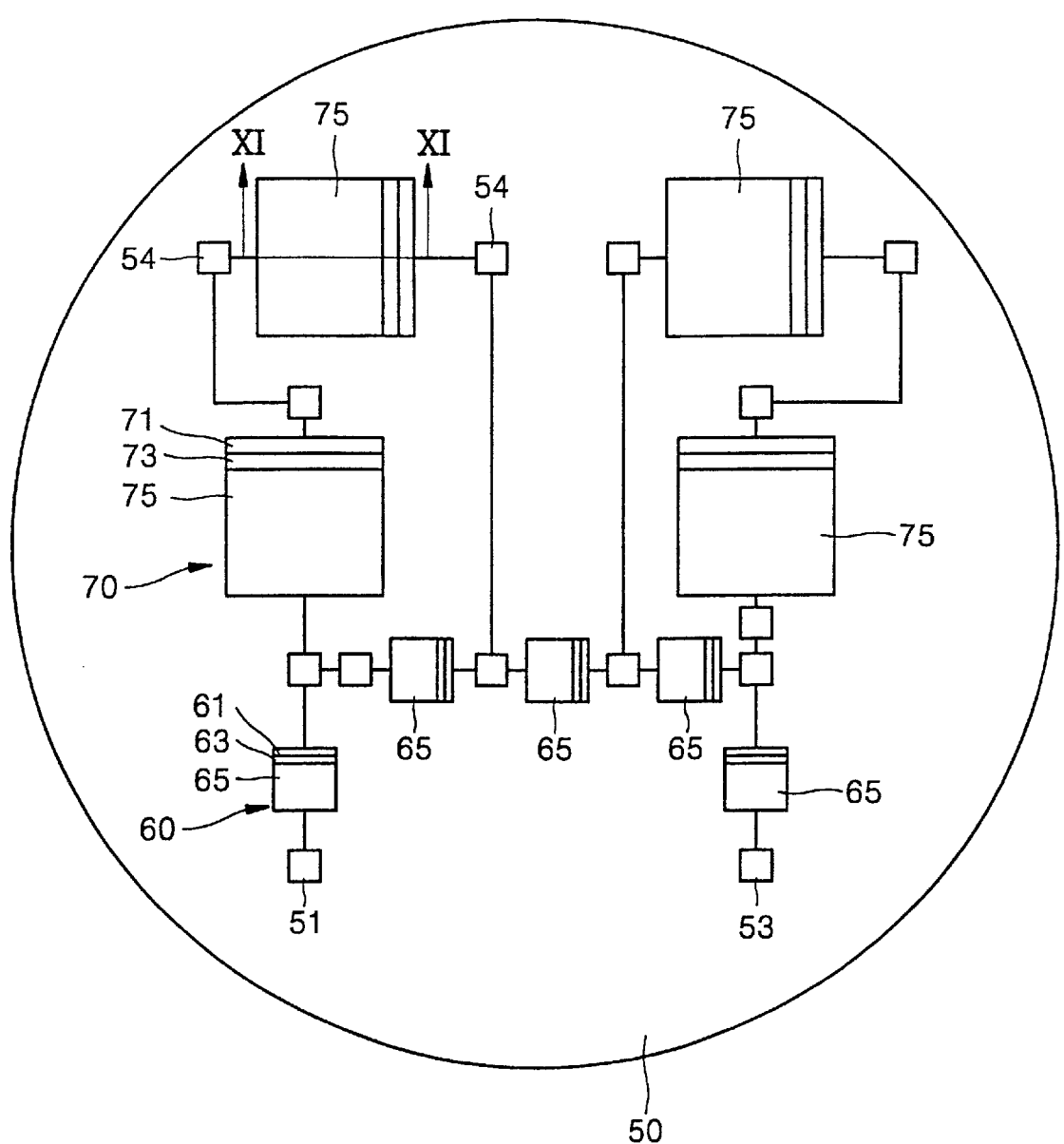
Figure 11:
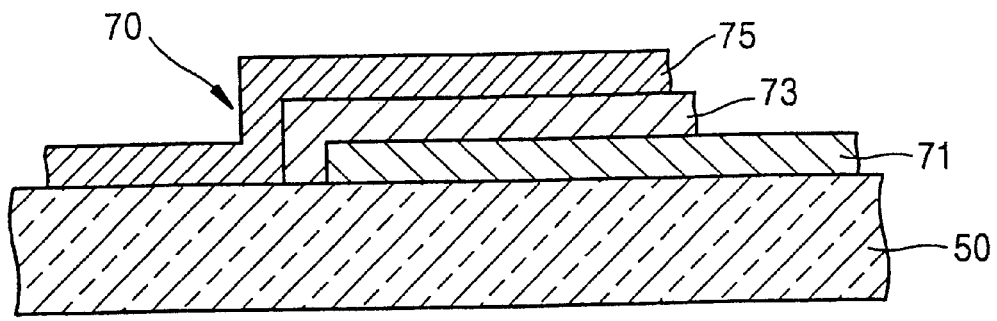

For a subsequent step, as shown in FIG. 10, the second metal layers 65 and 75 is formed on the dielectric layers 63 and 73. The second metal layers 65 and 75 are formed so that portions thereof oppose the substrate 50, covering the portions of the dielectric layers 63 and 73 formed on the substrate 50, to be connected directly to the lead pattern. As shown in FIG. 11, a portion of the second metal layer 75 formed on the substrate 50 is preferably extended from one side of the dielectric layer 73 so that the other connecting portion 85 of the inductor 80 formed by a subsequent process electrically contacts the second metal layer 75 at the same vertical position as the first metal layer 71. Here, the second metal layer and the lead pattern may be wire bonded when necessary. An alignment structure in which the plurality of first capacitors 60 are connected and arranged in series on the substrate 50, and the second capacitors 70 are connected in parallel to different branch terminals of the first capacitors 60, and a manufacturing process of the capacitors 60 and 70 are completed through the above processes.

Figure 12:
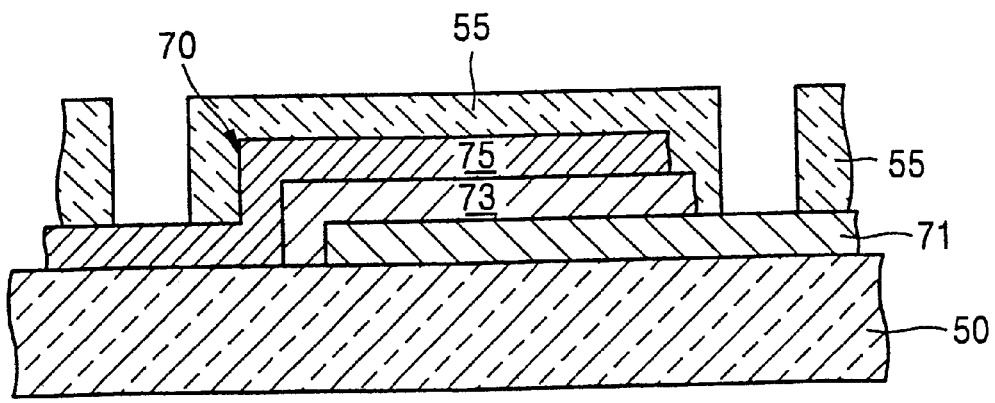
Figure 13:
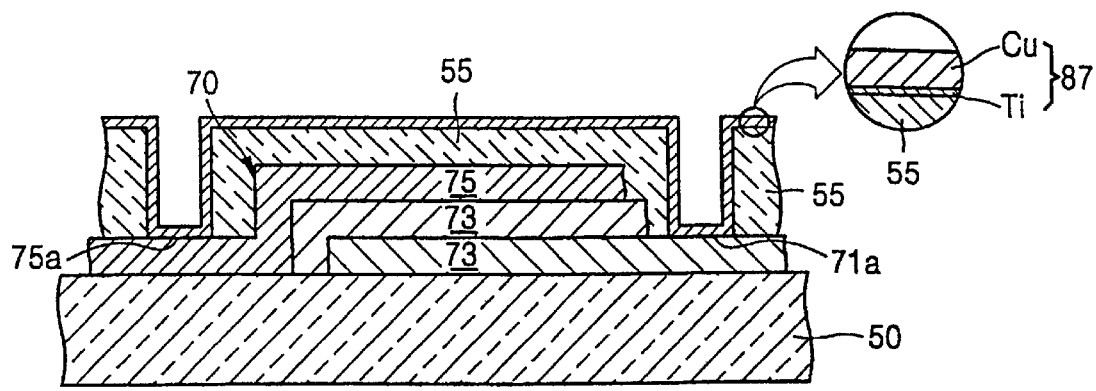
Figure 14:
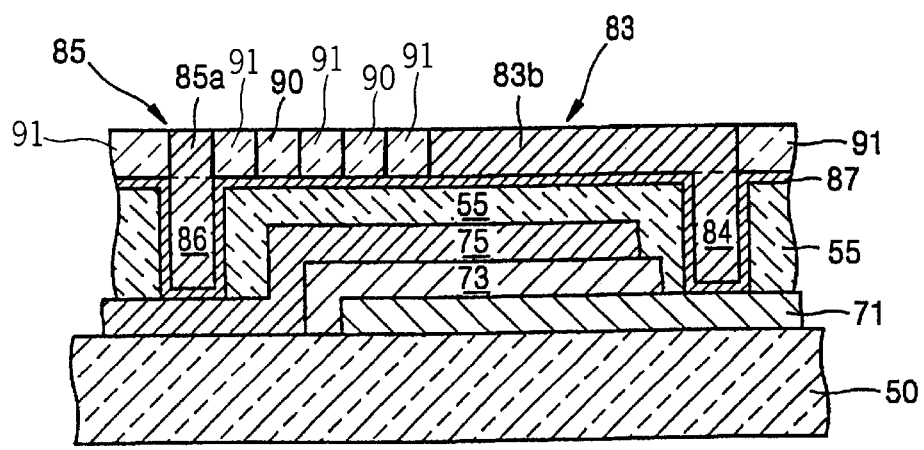
Figure 15:
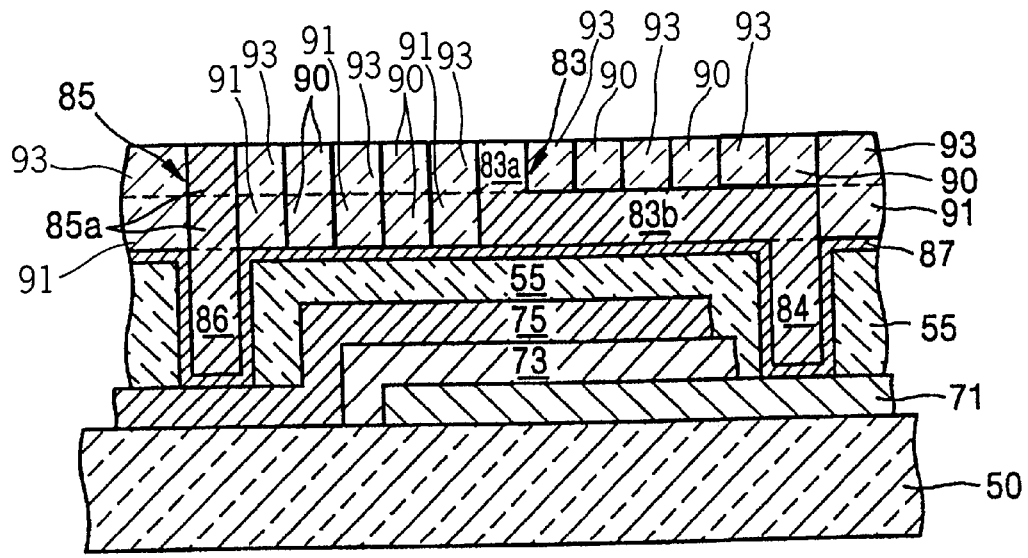

The following process is for forming the inductor 80 on the second capacitor 70. In the first place, as shown in FIG. 12, the insulating layer 55 is formed of a material such as SiO$_2$ on a region excluding portions of the top surfaces of the first and second metal layers 71 and 75 electrically contacted by the inductor 80 on the second capacitor 70. The insulating layer 55 may be formed over the entire area of the filter excluding a region for wire bonding as well as on top of the second capacitor 70. Here, if the inductor 80 is formed on the substrate 50 instead of the second capacitor 70, a step of forming the insulating layer 55 may be omitted. Then, as shown in FIG. 13, a first seed layer 87 is formed over the insulating layer 55 overlying the second capacitor 70 and the exposed surfaces 71a and 75a of the first and second metal layers 71 and 75. Manufacturing the first seed layer 87 includes forming a Ti layer to a thickness of about 200Å by sputtering, on which a Cu layer is formed to a thickness of about 1,000Å. Next, the first and second connecting portions 83 and 85, and the supports 90 are formed on the first seed layer 87. These are formed by performing a pattern process at least two times as shown in FIGS. 14 and 15. More specifically, as shown in FIG. 14, a position pattern 91 for the base portions 84 and 86 for connecting the first and second connecting portions 83 and 85 to the first and second metal layers 71 and 75, the horizontal portion 83b of the first connecting portion 83, and the supports 90 is formed on the first seed layer 87 using a photoresist with a thickness of, e.g., 8 μm.

Then, a metal layer is directly formed on the first and second metal layers 71 and 75 corresponding to positions of the base portions 84 and 86, or on each lead pattern connected electrically to both ends of the second capacitors 70 to form a pair of base portions 84 and 86. Next, a lower metal layer having a thickness of, e.g., 8 μm is formed on the top surfaces of the base portions 84 and 86 and the positions of the horizontal portion 83b of the first connecting portion 83 and supports 90. The lower metal layer is comprised of a material such as Cu and formed by electroplating. Here, if at least a portion of the inductor 80 is formed on the substrate, the inductor can be formed with a structure having no base portions 84 and 86. Repeatedly, as shown in FIG. 15, a position pattern 93 for the vertical portions 83a and 85a of the connecting portions 83 and 85 and the supports 90 is formed using photoresist with a thickness of, e.g., 8 μm, on which an upper metal layer having a thickness of, e.g. 8 μm, is formed. The upper metal layer is comprised of Cu, and formed by electroplating. As described above, the connecting portions 83 and 85, and the supports 90 are formed through two repetitions of a pattern process.

Figure 16:
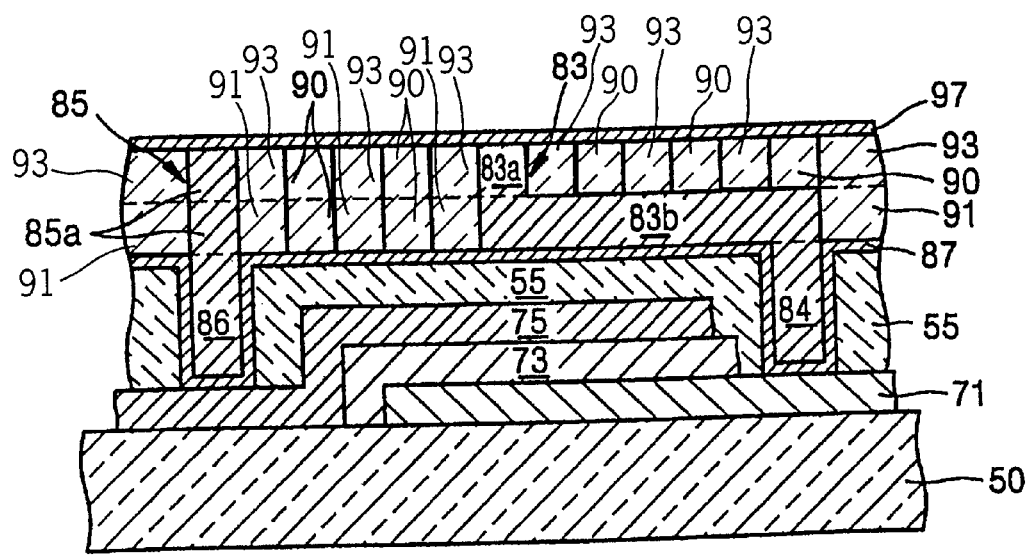
Figure 17:
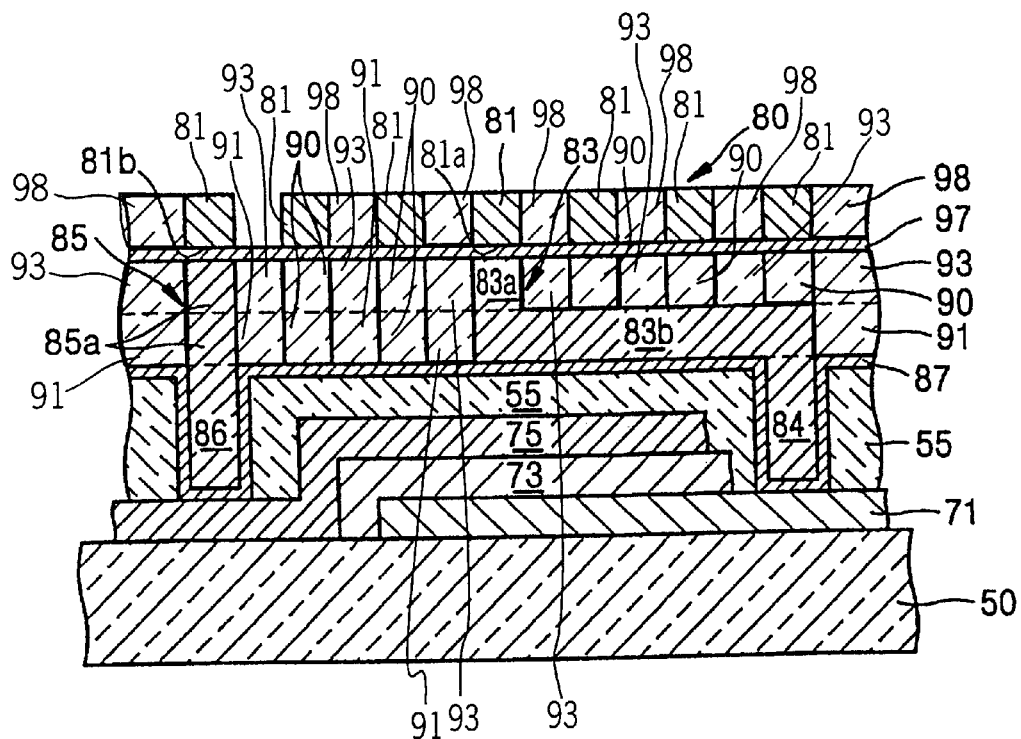

Referring to FIG. 16, the next step is to provide a second seed layer 97 over the first and second connecting portions 83 and 85, the support 90, and the photoresist layer 93. Like the first seed layer 87, the second seed layer 97 is preferably comprised of a Ti layer having a thickness of about 200Å and the overlying Cu layer having a thickness of about 1,000Å, and manufactured by the same manufacturing method. Then, as shown in FIG. 17, a position pattern 98 of the spiral inductor portion 81 having a predetermined number of turns is formed on the second seed layer 97 using photoresist with a thickness of, e.g., 8 μm so that the exterior end (81b of FIG. 4), and the interior end (81a of FIG. 4), respectively, are positioned above the vertical portions 83a and 85a of the connecting portions 83 and 85. Then, a metal layer having a thickness of, e.g., 8 μm is formed at the position of the spiral inductor portion 81. Like the connecting portions 83 and 85, and the support 90, the metal layer constituting the spiral inductor portion 81 is comprised of a material such as Cu, and formed by electroplating.

Figure 18:
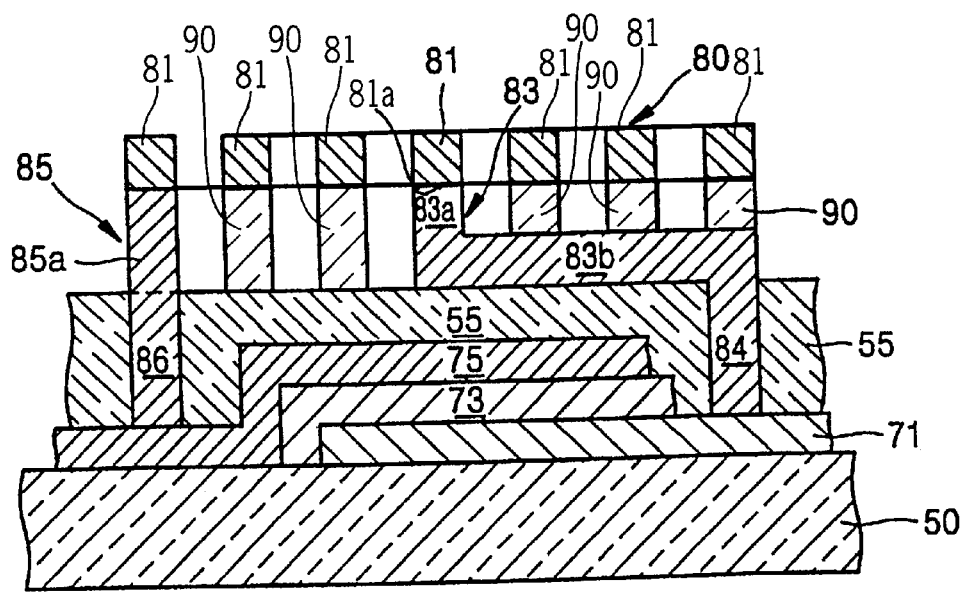

Finally, when the photoresist layers 91, 93 and 98 and the seed layers 87 and 97 are removed as shown in FIG. 18, a plurality of supports 90 and/or the connecting portions 83 and 85 are insulated from each other, thereby completing the thin-film bandpass filter having the structure shown in FIG. 4. The photoresist layers 91, 93 and 98, and the seed layers 87 and 97 are removed with acetone and Cu etching solution, respectively. If the first and second connecting portions 83 and 85, support 90, and spiral inductor portion 81 are not formed by electroplating, or if the material thereof is changed, a step of forming the first and second seed layers 87 and 97 may be omitted or the configuration thereof may be changed. Based on the foregoing, the capacitors 60 and 70 and the inductor 80 are stacked on the substrate 50 through a batch process and a thin-film bandpass filter according to the present invention has a structure in which the inductor 80 is suspended by the substrate 50 and/or the second capacitor 70.

Figure 19:
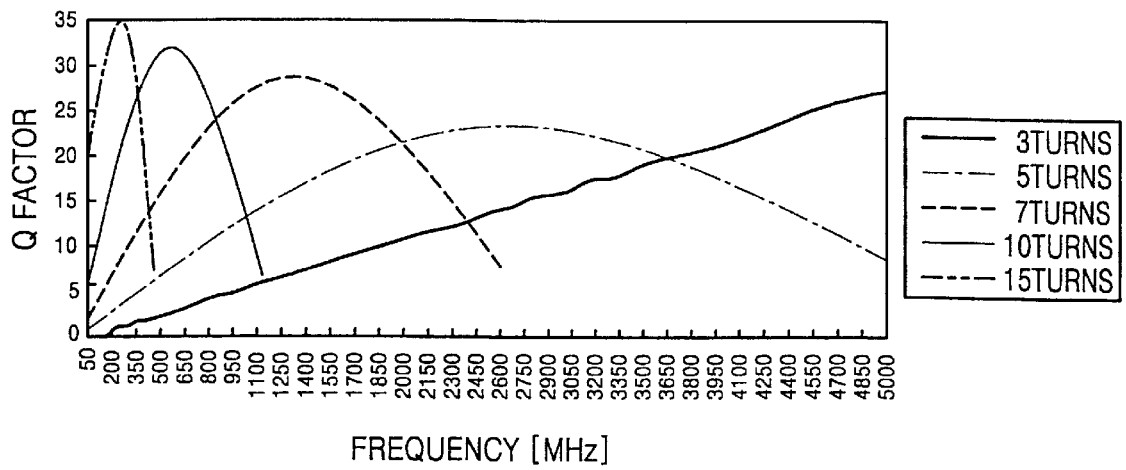
FIG. 19 is a graph illustrating the relationship between a frequency depending on the number of turns of the inductor and the Q-factor in the thin-film bandpass filter according to the present invention.

Referring to FIG. 19, showing a Q factor with respect to frequency in the thin-film bandpass filter according to the present invention having a structure described above, if the number of turns of the spiral inductor portion 81 is 3, the Q factor is increased approximately proportional to the increase of frequency, so that if the frequency is about 3.5 gigaherz (GHz), the Q factor is about 20. As the number of turns of the spiral inductor portion 81 is increased, the Q factor with respect to frequency represents a two-dimensional curve the width of which becomes smaller, and the maximum value of the Q factor is relatively increased. For example, if the number of turns of the spiral inducting portion 81 is 5, the Q factor is close to about 20 at a frequency of 2–3 GHz. As will understood by the foregoing, since the thin-film bandpass filter according to the present invention having the suspended structure of the thin-film inductor 80 minimizes the parasitic capacitance, it has a relatively large Q factor and thus the insertion loss of the filter is minimized.

Figure 20:
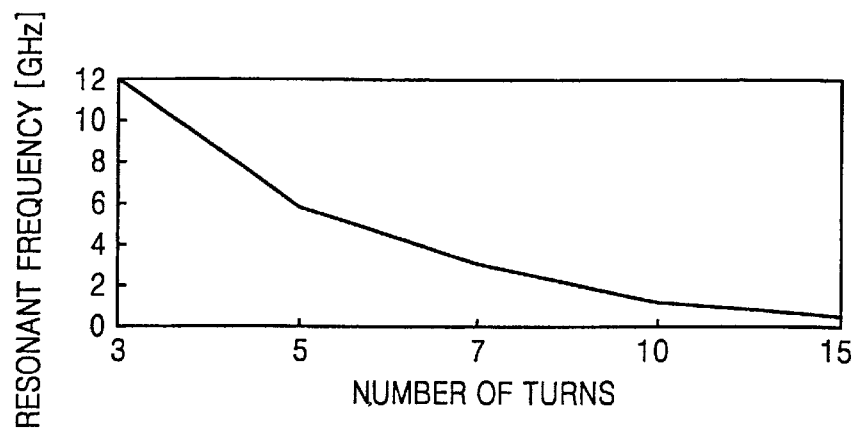
FIG. 20 is a graph illustrating the relationship between the number of turns of the inductor and a frequency in the thin-film bandpass filter according to the present invention.

Furthermore, referring to FIG. 20, in the thin-film bandpass filter according to the present invention, the resonant frequency of the spiral inductor portion 81 with respect to the number of turns thereof is reduced as the number of turns is increased. For example, when the number of turns is 3, the resonant frequency is about 12 GHz and when the number of turns is 5, the resonant frequency is about 6 GHz. However, the band of a resonant frequency is above several GHz which is large. As described in the foregoing, since the thin-film bandpass filter according to the invention has resonant frequency of the inductor 80 equivalent to above several GHz in the frequency band, the inductor 80 is of a very wide range for use. Furthermore, due to an inductor-suspended structure, the thin-film bandpass filter according to the present invention can significantly reduce the overall size of the filter by forming at least a portion of the inductor above the capacitor, while minimizing the manufacturing cost since the filter is manufactured in a stacked form through a batch process Accordingly, the thin-film bandpass filter according to the present invention can be used in a variety of applications such as a bandpass filter of intermediate frequency and can filter signals in a frequency band ranging from several hundred MHz to several ten GHz depending on the number of turns of a spiral inductor portion, thereby allowing application to a bluetooth module using the Industrial Scientific Medical (ISM) band of about 2.4 GHz.

As stated above, the preferred embodiment of the present invention is shown and described. Although the preferred embodiment of the present invention has been described, it is understood that the present invention should not be limited to this preferred embodiment but various changes and modifications can be made by one skilled in the art within the spirit and scope of the present invention as hereinafter claimed.

What is claimed is:

1. A thin-film bandpass filter, comprising:
   a substrate;
   a plurality of first capacitors formed on the substrate, each being electrically connected in series;
   at least one second capacitor electrically connected to branch terminals positioned between the plurality of first capacitors;
   an inductor electrically connected in parallel to the second capacitor; and
   a plurality of supports for propping up the inductor so that the inductor is separated a predetermined space above the substrate and/or the second capacitor;
   wherein the first and second capacitors, respectively, comprise a first metal layer, a dielectric layer, and a second metal layer, all of which are sequentially formed on the substrate, and
   wherein the inductor is comprised of a predetermined pattern of a thin-film metal layer propped by the plurality of supports, to both ends of which are electrically connected to the first and second metal layers of the second capacitor, and suspended by the substrate and/or the second capacitor, wherein the inductor comprises
   a spiral inductor portion having at least one turn, formed in a flat spiral shape above the supports and propped by the supports;
   a first connecting portion for electrically connecting an interior end of the spiral inductor portion and one metal layer of the second capacitor, the first connection portion including a vertical portion extending downward from the interior end of the spiral inductor portion, and a horizontal portion extending from one side of the vertical portion to be separated from the spiral inductor portion; and
   a second connecting portion for electrically connecting an exterior end of the spiral inductor portion and the other metal layer of the second capacitor, the second connection portion including a vertical portion extending downward from the exterior end of the spiral inductor portion.

2. The thin-film bandpass filter of claim 1, wherein the vertical portions of the first and second connecting portions are metal-made supports for propping up the both ends of the spiral inductor portion.

3. The thin-film bandpass filter of claim 1, wherein at least a portion of the supports are formed on the second capacitor and at least a portion of the spiral inductor portion of the inductor is positioned above the second capacitor.

4. The thin-film bandpass filter of claim 3, further comprising an insulating layer formed on a region of the second capacitor excluding a portion for electrically connecting both ends of the spiral inductor portion and the first and second metal layers.

5. The thin-film bandpass filter of claim 1, wherein at least a portion of the supports are formed on the second capacitor and at least a portion of the spiral inductor portion of the inductor is positioned above the second capacitor.

6. The thin-film bandpass filter of claim 5, further comprising an insulating layer on a region of the second capacitor excluding a portion for electrically connecting both ends of the spiral inductor portion and the first and second metal layers.

7. The thin-film bandpass filter of claim 1, said filter being manufactured by a method comprising the steps of:
   preparing said substrate;
   sequentially providing said first metal layer, a dielectric layer and said second metal layer at predetermined positions on the substrate to form a said at least one first capacitor, each of which is independent, and said at least one second capacitor;
   providing a plurality of contact pads and a lead pattern on the substrate to form an electrical connection structure between the first and second capacitors so that the first capacitors are electrically connected in series to each other by the lead pattern and the second capacitor is connected to a branch terminal formed between the first capacitors;
   forming said plurality of supports having a predetermined height on the substrate and/or the second capacitor; and
   forming said inductor comprising said first and said second connecting portions electrically connected to the first and second metal layers of the second capacitor, and said inductor portion formed of a predetermined pattern of a metal layer on the supports and propped by the supports, and in which both ends of the inductor portion are connected in parallel to the second capacitor by the first and second connecting portions.

8. The thin-film bandpass filter of claim 7, the metal layer of the inductor portion is formed in a flat spiral pattern having one or more turns.

9. The thin-film bandpass filter of claim 7, at least a portion of the supports are formed on the second capacitor and at least a portion of the inductor portion is positioned above the second capacitor.

10. The thin-film bandpass filter of claim 9, said method of manufacturing further comprising the step of forming an insulating layer on a region of the second capacitor excluding a portion for electrically connecting the inductor portion and the first and second metal layers.

11. The thin-film bandpass filter of claim 7, the first connecting portion comprises:
   a first vertical portion extending downward from an interior end of the inductor portion, and a horizontal portion extending from one side of the second vertical portion, separated from the inductor portion, and electrically connected to one metal layer of the second capacitor, the second connecting portion comprises a second vertical portion extending downward from an exterior end of the inductor portion and electrically connected to the other metal layer of the second capacitor.

12. The thin-film bandpass filter of claim 11, the step of forming the inductor comprises the steps of:
   forming a position pattern of the second vertical portion of the second connecting portion and the horizontal portion of the second connecting portion using photoresist to provide a lower metal layer at the positions of the second vertical portion and the horizontal portion;
   forming a position pattern of the first vertical portion of the first connecting portion and the second vertical portion of the second connecting portion using photoresist to provide an upper metal layer at the positions of the first and second vertical portions;
   providing a metal layer in a predetermined pattern on the photoresist layers and the upper metal layer to form the inductor portion; and
   removing the photoresist layers.

13. The thin-film bandpass filter of claim 12, the step of forming the inductor further comprises the steps of:
   forming a first seed layer prior to the step of forming the lower metal layer;
   forming a second seed layer between the step of forming the upper metal layer and the step of forming the inductor portion; and
   removing the first and second seed layers following the step of forming the inductor portion.

14. The thin-film bandpass filter of claim 13, the seed layers are formed by sequentially sputtering Ti and Cu, and
   wherein the upper and lower metal layers and the inductor portion are formed by electroplating Cu.

15. The thin-film bandpass filter of claim 12, the supports are comprised of the same metal material as the vertical portions of the first and second connecting portions, and wherein a support position pattern is formed and then the lower and upper metal layers are formed at the support position, in the step of forming the vertical portions of the first and second connecting portions.

16. A method of manufacturing a thin-film bandpass filter, the method comprising the steps of:
   preparing a substrate;
   sequentially providing a first metal layer, a dielectric layer and a second metal layer at predetermined positions on the substrate to form a plurality of first capacitors, each of which is independent, and at least one second capacitor;
   providing a plurality of contact pads and a lead pattern on the substrate to form an electrical connection structure between the first and second capacitors so that the first capacitors are electrically connected in series to each other by the lead pattern and the second capacitor is connected to a branch terminal formed between the first capacitors;
   forming a plurality of supports having a predetermined height on the substrate and/or the second capacitor; and
   forming an inductor including first and second connecting portions electrically connected to the first and second metal layers of the second capacitor, and an inductor portion formed of a predetermined pattern of a metal layer on the supports and propped by the supports, and in which both ends of the inductor portion are connected in parallel to the second capacitor by the first and second connecting portions, wherein the first connecting portion comprises:
   a first vertical portion extending downward from an interior end of the inductor portion, and a horizontal portion extending from one side of the first vertical portion, separated from the inductor portion, and electrically connected to one metal layer of the second capacitor, and
   wherein the second connecting portion comprises a second vertical portion extending downward from an exterior end of the inductor portion and electrically connected to the other metal layer of the second capacitor.

17. The method of claim 16, wherein at least one side of the first and/or second capacitors is formed so that portions of the dielectric layer and the second metal layer may face the substrate, the second metal layer being electrically connected to a lead pattern formed on the substrate.

18. The method of claim 17, wherein the first metal layer of the first and second capacitors, the contact pads, and the lead pattern are formed by the same process.

19. The method of claim 16, wherein the first metal layer of the first and second capacitors, the contact pads, and the lead pattern are formed by the same process.

20. The method of claim 16, wherein the substrate is made of one selected from the group consisting of ceramic, plastic, and PCB materials.

21. The method of claim 16, wherein the metal layer of the inductor portion is formed in a flat spiral pattern having one or more turns.

22. The method of claim 16, wherein at least a portion of the supports are formed on the second capacitor and at least a portion of the inductor portion is positioned above the second capacitor.

23. The method of claim 22, further comprising the step of forming an insulating layer on a region of the second capacitor excluding a portion for electrically connecting the inductor portion and the first and second metal layers.

* * * * *